(12) United States Patent
Hubbard

(10) Patent No.: US 9,780,721 B2
(45) Date of Patent: Oct. 3, 2017

(54) SOLAR PANEL CHARGING INHIBITOR

(71) Applicant: Firestone Building Products Company, LLC, Indianapolis, IN (US)

(72) Inventor: Michael J. Hubbard, Anderson, IN (US)

(73) Assignee: Firestone Building Products Company, LLC, Indianapolis, IN (US)

(*) Notice: Subject to any disclaimer, the term of this patent is extended or adjusted under 35 U.S.C. 154(b) by 82 days.

(21) Appl. No.: 14/750,667

(22) Filed: Jun. 25, 2015

(65) Prior Publication Data
US 2015/0381107 A1 Dec. 31, 2015

Related U.S. Application Data

(60) Provisional application No. 62/016,857, filed on Jun. 25, 2014.

(51) Int. Cl.
| | |
|---|---|
| *H02S 40/00* | (2014.01) |
| *H02S 20/20* | (2014.01) |
| *H02S 20/22* | (2014.01) |
| *F24J 2/46* | (2006.01) |
| *F24J 2/52* | (2006.01) |
| *H01L 31/02* | (2006.01) |
| *H02S 20/24* | (2014.01) |

(52) U.S. Cl.
CPC ............. *H02S 40/00* (2013.01); *F24J 2/4621* (2013.01); *H01L 31/02* (2013.01); *H02S 20/24* (2014.12); *F24J 2/523* (2013.01); *Y02B 10/12* (2013.01); *Y02E 10/40* (2013.01); *Y02E 10/50* (2013.01)

(58) Field of Classification Search
CPC .......... H02S 40/00; H02S 20/24; H02S 20/20; H02S 20/22; H02S 20/23; F24J 2/46; F24J 2/4609; F24J 2/4621; F24J 2/4638; F24J 2/4641; F24J 2/4645; F24J 2/523; H01L 31/02; H01L 31/0203; H01L 31/049

See application file for complete search history.

(56) References Cited

U.S. PATENT DOCUMENTS

| | | | |
|---|---|---|---|
| 8,276,329 B2* | 10/2012 | Lenox | E04D 13/172 52/173.3 |
| 2010/0269889 A1* | 10/2010 | Reinhold | F24J 2/5232 136/251 |
| 2013/0205692 A1 | 8/2013 | Hubbard et al. | |
| 2013/0234822 A1* | 9/2013 | Aurich | B22D 41/015 337/416 |

FOREIGN PATENT DOCUMENTS

CN 202209802 u * 5/2012

OTHER PUBLICATIONS cn202209802u, Chen et al. May 2012, English machine translation.*

* cited by examiner

*Primary Examiner* — Susan D Leong
(74) *Attorney, Agent, or Firm* — Taylor IP, P.C.

(57) ABSTRACT

A solar panel assembly includes a solar panel having a frame and a solar harvesting surface held by the frame; and a shield assembly having a solar shield movable between an operating position and a shielding position and a heat sensitive element. The solar shield is configured to automatically assume the shielding position after the heat sensitive element reaches and/or exceeds an activation temperature.

17 Claims, 5 Drawing Sheets

SOLAR PANEL CHARGING INHIBITOR

CROSS REFERENCE TO RELATED APPLICATIONS

This is a non-provisional application based upon U.S. provisional patent application Ser. No. 62/016,857, entitled "SOLAR PANEL CHARGING INHIBITOR", filed Jun. 25, 2014, which is incorporated herein by reference.

BACKGROUND OF THE INVENTION

1. Field of the Invention

The present invention relates to solar panels, and, more particularly, to devices that inhibit solar panel charging.

2. Description of the Related Art

Solar panels are a well-known technology that utilize solar energy to produce usable electricity. Solar panels can be installed in many different places to harvest solar energy, e.g., building rooftops, fields, road-side signs, and vehicles. Solar panels can make an economical addition to a building rooftop because the rooftop space is usually not utilized for other purposes and the solar panels allow for the building to consume less electricity from the grid. Additionally, if the solar panels produce more electricity than the building consumes, that excess electricity can be fed back into the grid. One drawback to installing solar panels on a building rooftop is that even if the solar panels are disconnected from the grid, they will continue to produce electricity. This can be hazardous for firefighters on the roof of a burning building. Not only do the solar panels continue to produce electricity during a fire, but the support structure for the solar panels can produce air flow beneath the panels that supplies oxygen to the fire underneath the support structure.

What is needed in the art is a way to inhibit charging of solar panels.

SUMMARY OF THE INVENTION

The present invention provides a releasable solar shield that can automatically cover solar panels and prevent them from producing electricity under certain conditions.

The invention in one form is directed to a solar panel assembly including a solar panel having a frame and a solar harvesting surface held by the frame; and a shield assembly having a solar shield movable between an operating position and a shielding position and a heat sensitive element. The solar shield is configured to automatically assume the shielding position after the heat sensitive element reaches and/or exceeds an activation temperature.

The invention in another form is directed to a solar panel assembly including a solar panel having a frame and a solar harvesting surface held by the frame; a shield assembly having a solar shield movable between an operation position and a shielding position, the solar shield at least partially covering the solar harvesting surface in the shielding position; and a heat sensitive element associated with the solar shield and defining an activation temperature. The heat sensitive element allows the solar shield to assume the shielding position from the operating position after the heat sensitive element reaches and/or exceeds the activation temperature.

An advantage of the present invention is that the solar panel can stop producing electricity during certain hazardous conditions, such as a rooftop fire.

Another advantage is the shield assembly can be adapted to a variety of solar panels.

Yet another advantage is the shield assembly does not damage the solar panel or associated electrical components to stop electricity production.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplifications set out herein illustrate embodiments of the invention and such exemplifications are not to be construed as limiting the scope of the invention in any manner.

DETAILED DESCRIPTION OF THE INVENTION

Figure 1:
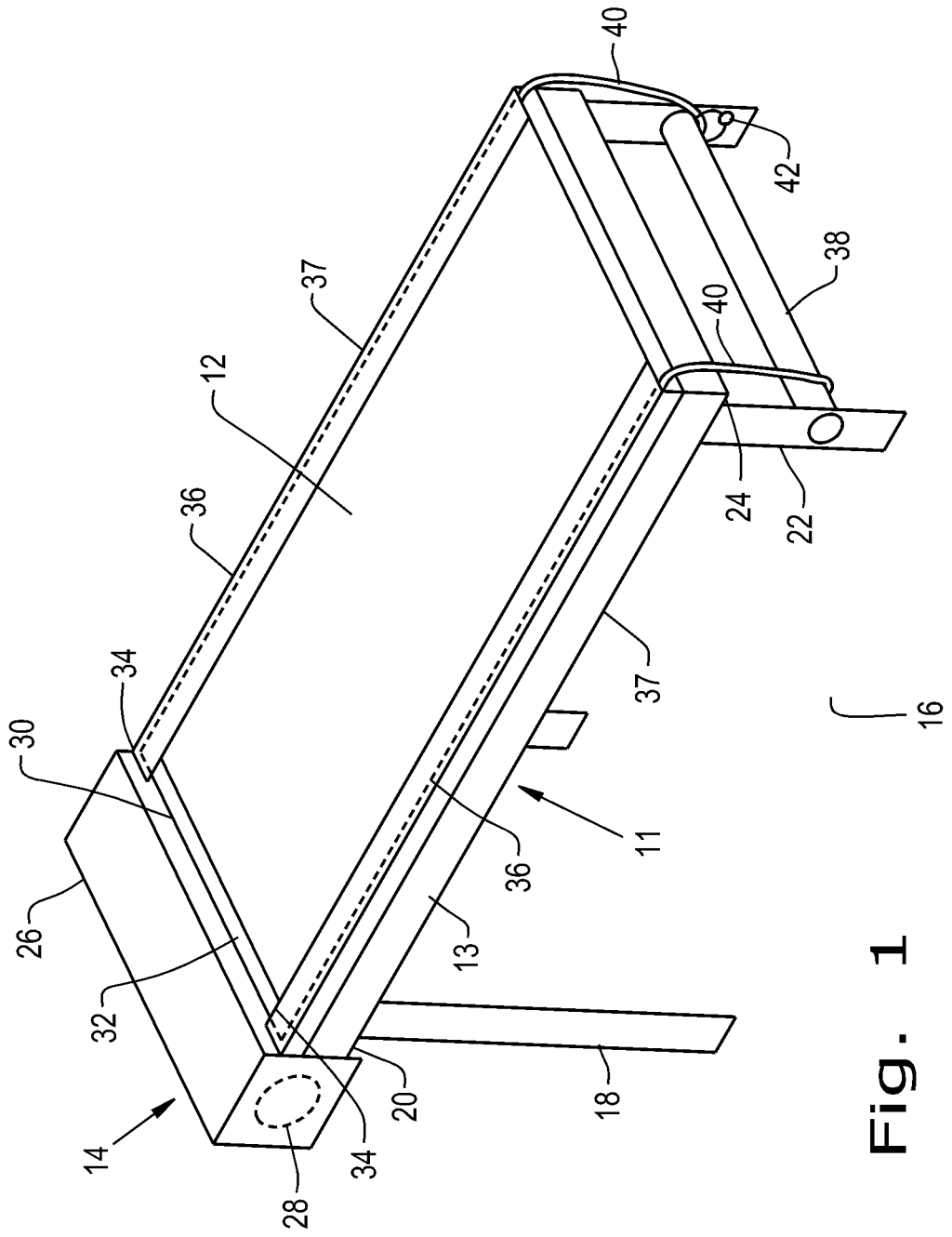
FIG. 1 is a perspective view of an embodiment of a solar panel assembly formed according to the present invention.

Referring now to the drawings, and more particularly to FIG. 1, there is shown an embodiment of a solar panel assembly 10 according to the present invention which generally includes a solar panel 11 which includes a frame 13 and a solar harvesting surface 12 held by the frame 13 and a solar shield assembly 14. Although not shown, electrical connections and other parts can be housed by the frame 13 to control the solar panel 11 as well as transfer the energy gathered by the solar harvesting surface 12. The solar harvesting surface 12 can be any type of surface arrangement that converts solar energy into electricity. As can be seen, the solar panel assembly 10 is placed on a rooftop 16 so it can harvest solar energy. The frame 13 can have a first support leg 18 at one end 20 and a second support leg 22 at an opposite end 24. The first support leg 18 can be longer than the second support leg 22, which angles the solar panel 11 so that the solar harvesting surface 12 can have a larger amount of solar energy contacting the surface 12, which produces more electricity. The angle formed by the height difference between first support leg 18 and second support leg 22 is shown as being relatively low for illustrative purposes, but any angle of the frame 13 and held solar harvesting surface 12 is contemplated as being used. While solar harvesting surfaces are usually angled to capture solar energy, it is also contemplated that a flat frame 13 can hold the solar harvesting surface 12.

The solar panel assembly 10, as shown in FIG. 1, includes a solar shield assembly 14 that does not rely on gravity to deploy. The solar shield assembly 14 can include a cover holder 26 at a first end 20 of the frame 13 that has a rolled solar shield 28 held within. The cover holder 26 also includes a slot 30, which the solar shield 28 can be fed through to cover the solar harvesting surface 12. The solar shield 28 can be made out of a large variety of materials that do not allow solar energy to pass through, with useful materials being those that will not burn away when exposed to the temperature of a fire, i.e., fireproof. Such materials can include metals such as various steel and aluminum compositions used in fire damper systems, as well as various fireproof fabrics. As can be seen, an end 32 of the solar shield 28 is held in the slot 30 and the side edges 34 of the end 32 are held within tracks 36 that extend along longitudinal sides 37 of the frame 13. The track 36 can extend from the cover holder 26 at the end 20 to the opposing second end 24 of the frame 13. A pulling mechanism 38, which can also be referred to as a tensile member, can be attached to a second support leg 22 of the frame 13 at end 24, as well as to the end 32 of the solar shield 28. The tensile member 38 can be any type of element or mechanism that can pull the rolled solar shield 28 from the cover holder 26 toward the tensile member 38, covering the solar harvesting surface 12 with the solar shield 28 in the process. As shown, the tensile member 38 is a spring loaded roller that has been pre-tensioned to spontaneously roll a spring material 40, which is connected to the end 32 of the solar shield 28, around the roller 38. Although shown as a spring loaded roller, the tensile member can be any type of tensile member that can pull the solar shield 28 across the solar harvesting surface 12 toward the tensile member.

A fusible link 42, which can also be referred to as a heat sensitive element, can be connected to the spring loaded roller 38 in such a way that rotation of the roller 38 is prevented. While shown as a fusible link 42, the heat sensitive element can be configured as any material or assembly, such as a pair of metal strips held together by a fusible alloy or a frangible light bulb filled with liquid, that loses structural integrity or otherwise activates by melting, charring, disintegrating, boiling, bursting, etc. at an activation temperature to allow the solar shield 28 to assume the shielding position. The activation temperature can be, for example, a fusible alloy's melting temperature or a liquid's boiling temperature. The fusible link 42 prevents the roller 38 from pulling the solar shield 28 across the solar harvesting surface 12 until the fusible link 42 reaches its activation temperature, which is chosen to be outside the normal operating range of the solar panel assembly 10. When the fusible link 42 reaches this activation temperature, it can begin to melt and/or otherwise fail and lose the structural integrity needed to prevent the roller 38 from rotating and pulling the solar shield 28 across the solar harvesting surface 12. The fusible link 42 can be connected to the second support leg 22 or any other location that prevents rotation of the spring loaded roller 38. In the event of a fire and the fusible link 42 losing its structural integrity, the spring loaded roller 38 will begin to roll and pull the solar shield 28 across the solar harvesting surface 12, preventing solar energy from contacting the solar harvesting surface 12 and producing electricity. The deployed solar shield 28 is therefore in a shielding position where it covers a significant portion of the solar harvesting surface 12 and prevents the solar panel 11 from producing electricity, making the rooftop 16 a safer environment for response teams to handle a fire. The cover holder 26 and pulling mechanism 38 can be placed on the solar panel assembly 10 where they will not interfere with the solar harvesting surface 12 during normal operation, as shown. When the solar panel assembly 10 is used on a rooftop 16, it is useful if the fusible link 42 is located as close to the bottom of the solar panel assembly 10 as possible since a fire on the rooftop 16 will normally spread from beneath the solar panel assembly 10. Having the fusible link 42 as close to the rooftop 16 as possible will subject the fusible link 42 to the heat of the fire earlier and allow the solar shield 28 to be deployed.

While the solar shield 28 of the solar panel assembly 10 is shown in FIG. 1 as being rolled up in the cover holder 26, there are other operating positions the solar shield 28 can assume that do not substantially interfere with the solar panel 11 producing electricity. One such position is to have the solar shield "accordioned" within the shield assembly, similarly to fire dampers. The solar shield can also be pushed across the solar harvesting surface, rather than being pulled. It should therefore be appreciated that many different configurations of solar shields can be utilized to have an operating position where the solar harvesting surface 12 is mostly uncovered and a shielding position where the solar shield moves and/or changes shape to at least partially cover the solar harvesting surface 12 to significantly reduce, if not completely prevent, electricity generation by the solar panel 11.

Figure 2:
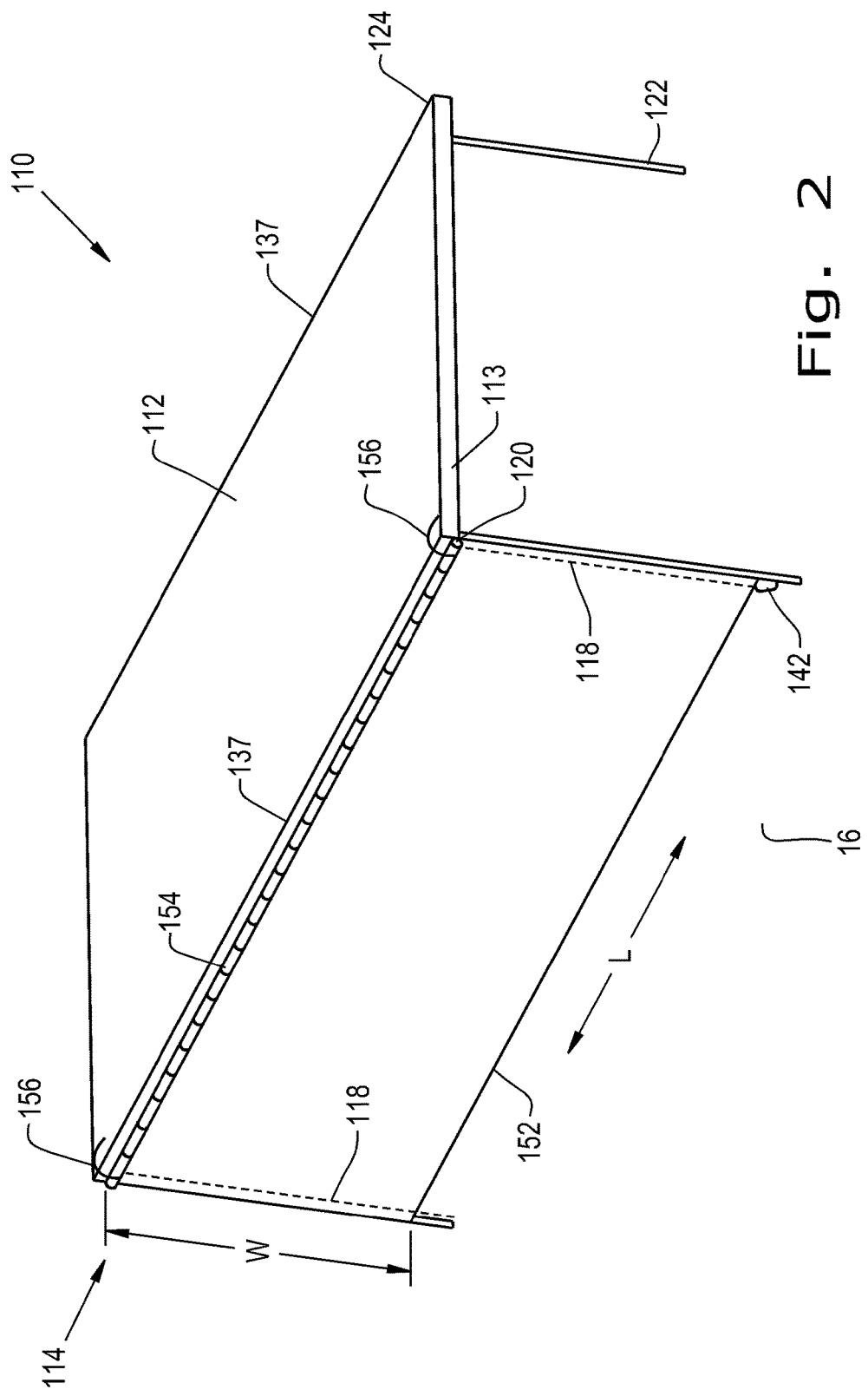
FIG. 2 is a perspective view of another embodiment of a solar panel assembly formed according to the present invention.

While FIG. 1 shows an embodiment of a solar panel assembly 10 that utilizes a solar shield 28 with a compacted (rolled) operating position before deploying into the shielding position, such a configuration is not necessary. Referring now to FIG. 2, another embodiment of a solar panel assembly 110 is shown that includes a solar shield assembly 114 with a solar shield 128 that is not compacted. For convenience of description, elements in the embodiment shown in FIG. 2 that are similar to elements in FIG. 1 are numbered similarly but raised by 100. The solar shield 128 has a length L and width W that roughly matches corresponding dimensions of the solar harvesting surface 112, so that once the solar shield 128 is moved into place the solar harvesting surface 112 is covered. A hinge 154 attaches the solar shield 128 to a side 137 of the frame 113 and allows the solar shield 128 to hang off the side 137 of the frame 113 and not interfere with solar energy hitting the solar harvesting surface 112. Springs 156 can be attached to the solar shield 128 adjacent to the hinge 154 to provide a tensile force that biases the solar shield 128 to rotate about the hinge 154 toward the solar harvesting surface 112. In this sense, the springs 156 can be considered a tensile member connected to the solar shield 128. One or more heat sensitive elements 142, shown as fusible links, attached to the solar shield 128 and a static location, such as the rooftop 16 or a leg of the frame 113, provide a counteracting tensile force to the tensile force of the tensile members 156 and prevent the solar shield 128 from being pulled on to the solar harvesting surface 112 by the tensile member 156. When the fusible link(s) 142 lose structural integrity at an activation temperature, the tensile members 156 will pull the solar shield 128 and cause the solar shield 128 to cover the solar harvesting surface 112, much like the cover of a book being closed. Other configurations are contemplated that do not require such a wide range of motion by the solar shield 128, such as having the solar shield rest parallel to the solar harvesting surface 112 off the sides 137 of the frame 113, and sliding across the solar harvesting surface 112 when the fusible link(s) 142 loses structural integrity.

Figure 3:
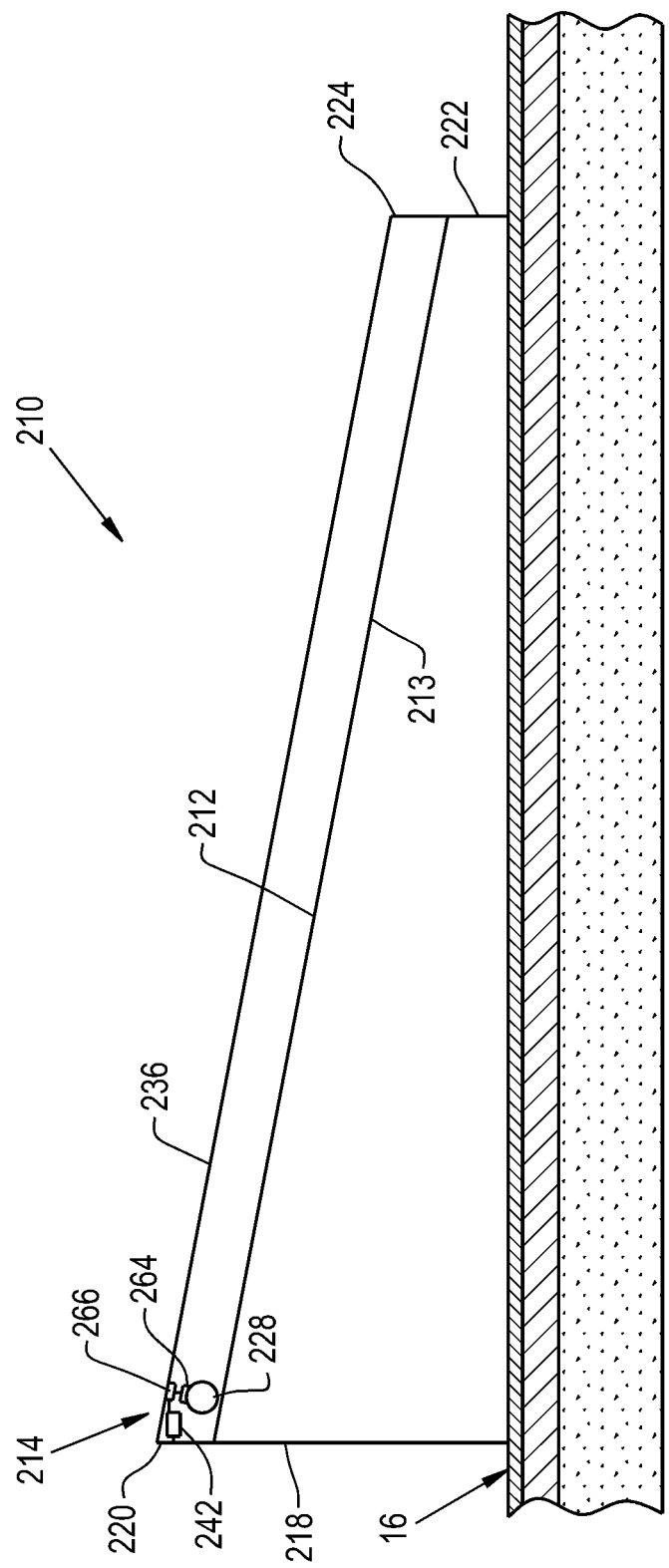
FIG. 3 is a sectional view of yet another embodiment of a solar panel assembly formed according to the present invention with a solar shield held in an operating position.
Figure 4:
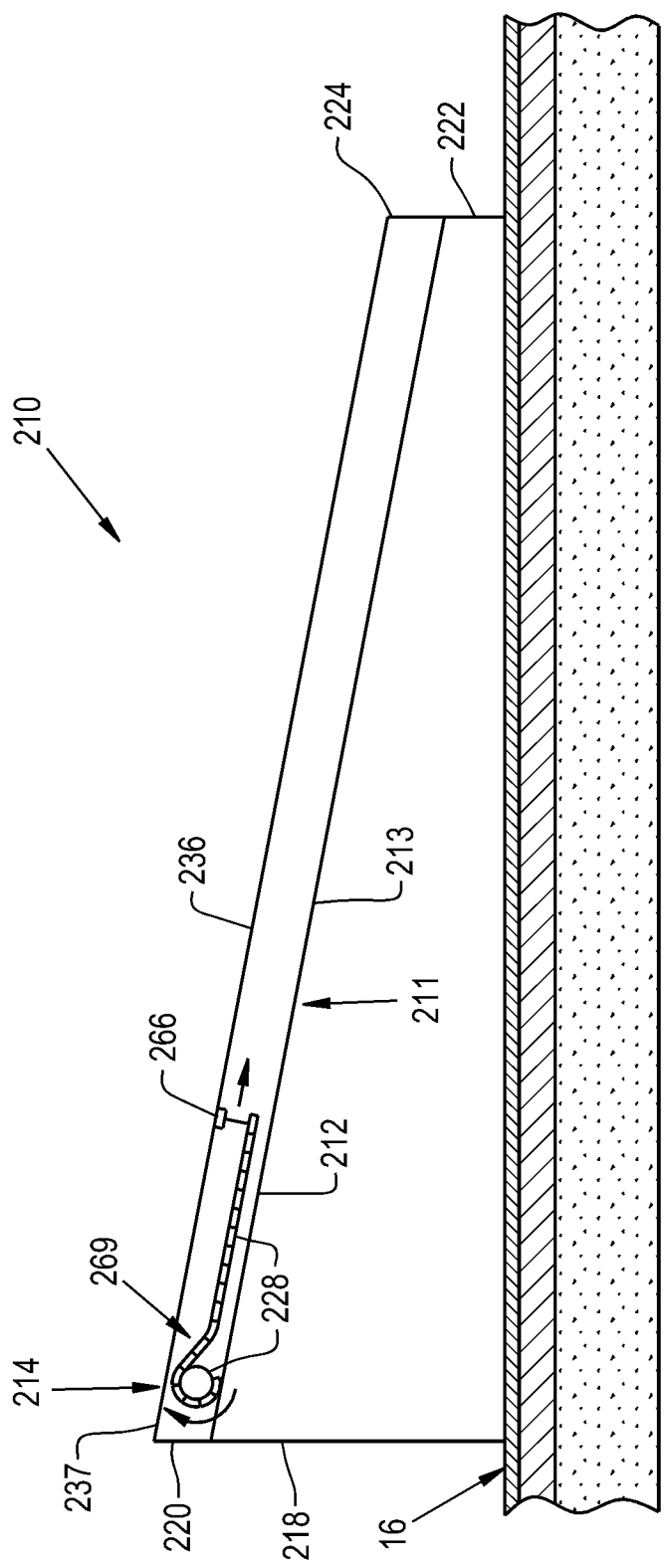
FIG. 4 is a sectional view of the solar panel assembly shown in FIG. 3 with the solar shield assuming the shielding position.

While previously shown and described solar shield assemblies have been dynamic assemblies that generate forces through various mechanisms, a solar shield assembly can utilize gravity to deploy the solar shield when a fire or other dangerous situation occurs. Referring now to FIGS. 3 and 4, another embodiment of a solar panel assembly 210 is shown that includes a solar shield assembly 214 with a solar shield 228 that is formed out of shield segments 264. For convenience of description, elements in the embodiment shown in FIGS. 3-4 that are similar to elements in FIG. 1 are numbered similarly but raised by 200. The solar shield 228 is held stationary relative to the solar harvesting surface 212 but can wind or unwind, allowing a sheet of shield segments 264 to unroll. The shield segments 264 are made of a material that prevents solar energy from passing through the segments 264. The shield segments 264 are connected to a slider 266 held within a track 236 that goes from a first support leg 218 to a second support leg 222 of a frame 213 along a side 237 of the frame 213. A heat sensitive element 242, shown as a fusible link, connects the slider 266 to the first support leg 218, which prevents the slider 266 from proceeding down the track 236. It is contemplated that the fusible link 242 can be any previously described heat sensitive element or fusible link. The fusible link 242 is configured to prevent the slider 266 from proceeding down the track 236 until the fusible link 242 reaches an activation temperature, which is chosen to be outside the normal operating range of the solar panel assembly 210. If the fusible link 242 reaches the activation temperature, it can begin to melt and/or fail and lose the structural integrity needed to prevent the slider 266 from proceeding down the track 236, pulling the shield segments 264 with it and unrolling the solar shield 228 as the slider 266 proceeds down the track 236. While the fusible link 242 is shown as connecting the slider 266 to the first support leg 218, the fusible link 242 can connect the slider 266 to other things that would prevent the slider 266 from advancing down the track 236, such as the frame 213, the solar harvesting surface 212 or a counterweight.

Once the fusible link 242 loses structural integrity, as shown in FIG. 4, the slider 266 is no longer connected to the first support leg 218 and is free to slide down the track 236, taking advantage of the angular slope of the frame 213. As the slider 266 slides down the track 236, the shield segments 264 unroll and cover the solar harvesting surface 212. The slider 266 can be weighted to produce sufficient unrolling force as it slides down the track 236 to overcome adhesive forces between shield segments 264 as they unroll and completely unroll the shield segments 264 into the solar shield 228 that covers the solar harvesting surface 212. Since the shield segments 264 are made of a material that substantially inhibits solar energy from passing through, the solar panel 211 will no longer produce a substantial amount of electrical energy once the shield segments 264 deploy into the solar shield 228 and cover the solar harvesting surface 212.

Figure 5:
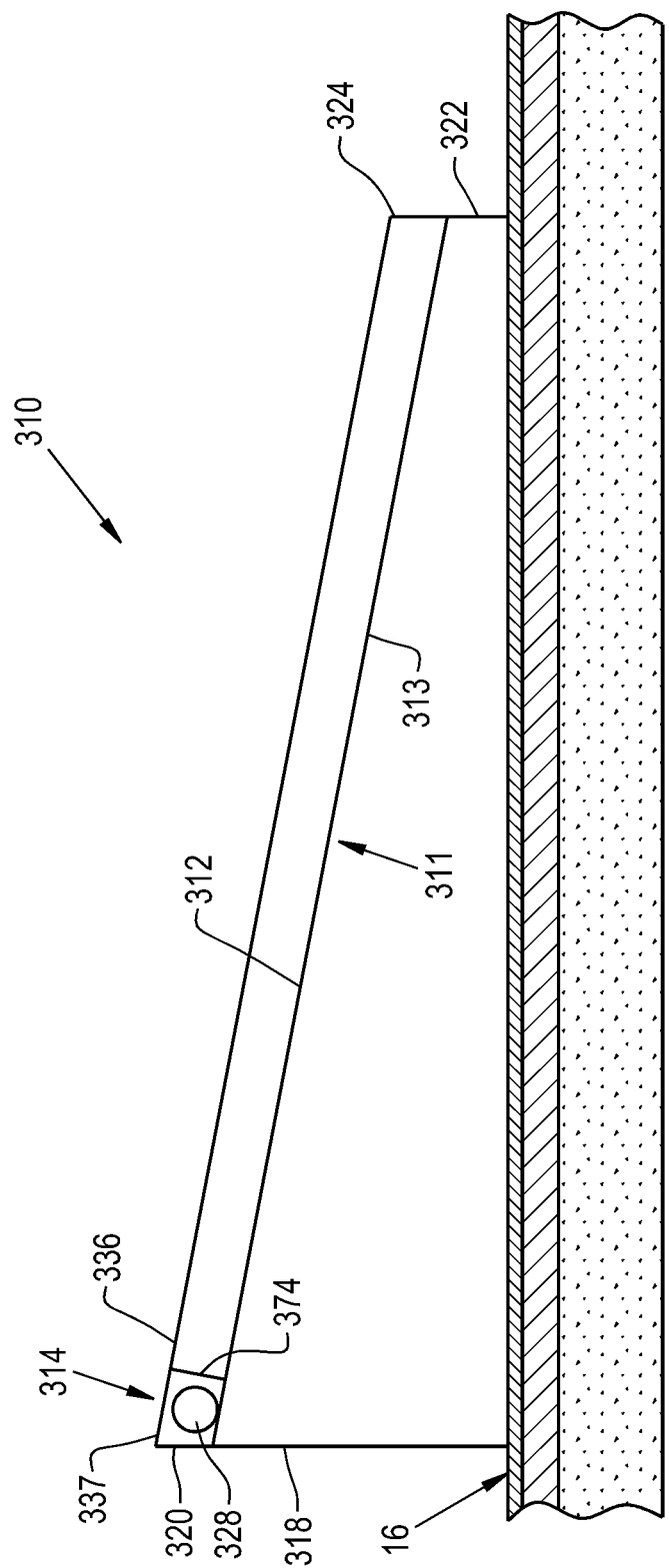
FIG. 5 is a sectional view of yet another embodiment of a solar panel assembly formed according to the present invention with a thermal gate holding a solar shield in an operating position.

In yet another embodiment of a solar panel assembly 310 shown in FIG. 5, a solar shield assembly 314 is shown that includes a solar shield 328, shown as a roll of material, held in a track 336 on sides 337 of a frame 313 of the solar panel assembly 310. The material in the roll 328 also prevents solar energy from passing through. For convenience of description, elements in the embodiment shown in FIG. 5 that are similar to elements in FIG. 1 are numbered similarly but raised by 300. A thermal gate 374 can prevent the material roll 328 from naturally unrolling, keeping the solar harvesting surface 312 clear. The thermal gate 374 can comprise a material with an activation temperature, such as a melting temperature, that is above normal solar panel assembly 310 operating temperatures but below extreme temperatures, such as those that occur during a fire. Once the melting temperature is reached, the thermal gate 374 can begin to melt and after a certain amount of melting will no longer be able to prevent the material roll 328 from unrolling down the track 336, covering the solar harvesting surface 312 as the material roll 328 unfolds. Optionally, the thermal gate 374 can include a fusible link connecting a gate to the track 336 in tension, which holds the gate upright and prevents the material roll 328 from unrolling down the track 336. If the fusible link melts and/or fails due to a sufficiently high temperature, the tension holding the gate upright would be lost and the gate would fall over, allowing the material roll 328 to unroll down the track 336 and deploy into the shielding position. Although not shown, it is also contemplated that a compressed spring can be placed adjacent to the material roll 328 such that it pushes the material roll 328 into the thermal gate 374. Once the thermal gate 374 fails, the spring would be free to release stored energy and push the material roll 328 along the track 336, covering the solar harvesting surface 312 in the process. This configuration can be used on flat solar assemblies or allow placement of the material roll 328 and thermal gate 374 near the second end 324 of the frame 313, since the spring would alleviate the need for the material roll 328 to be unrolled by gravity. It should therefore be appreciated that the heat sensitive element(s), as described, is associated with the solar shield in the sense that the heat sensitive element(s) provides some sort of impediment to the solar shield spontaneously assuming the shielding position until the heat sensitive element(s) reaches an activation temperature. Alternatively, the heat sensitive element(s) can actively cause a force to be applied to the solar shield so that the solar shield assumes the shielding position at an activation temperature.

While the embodiments of the various solar shield assemblies shown have the solar shields travelling from first end of the frame toward the second end of the frame down the length of the solar harvesting surface, it should be appreciated that a solar shield assembly can have the solar shield travelling between the sides of the frame, which corresponds roughly to the width of the solar harvesting surface. Since the width of the frame is typically smaller than the length, such a configuration can provides a shorter travel path for the solar shield across the solar harvesting surface.

It is useful to pair the solar shield assemblies of the present invention with movable barrier assemblies that prevent the formation of air flow under the solar panel assembly, as disclosed in U.S. Patent Application Publication No. 2013/0205692 which is incorporated herein by reference. The heat sensitive element(s) of the present invention, such as a fusible link, is contemplated as not only allowing the solar shield to be deployed into the shielding position and cover the solar harvesting surface when the fusible link loses structural integrity, but also deploying a barrier included with the solar panel assembly that can cover the sides of the solar panel assembly and prevent air flow from being produced underneath. The fusible link that causes the solar shield to be deployed can be the same fusible link that causes the barrier to deploy, or it can be multiple fusible links.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A solar panel assembly, comprising:
   a solar panel having a frame and a solar harvesting surface held by said frame; and
   a shield assembly having a solar shield movable between an operating position and a shielding position and a heat sensitive element, said solar shield being configured to automatically assume said shielding position after said heat sensitive element at least one of reaches and exceeds an activation temperature;
   wherein said heat sensitive element at least one of melts, chars, disintegrates, boils, and bursts at said activation temperature.

2. The solar panel assembly according to claim 1, wherein said heat sensitive element is a fusible link configured to hold said solar shield in said operating position.

3. The solar panel assembly according to claim 2, wherein said activation temperature is a melting temperature of said fusible link, said solar shield being configured to move said shielding position after said fusible link at least one of reaches and exceeds said melting temperature.

4. The solar panel assembly according to claim 2, further comprising a tensile member connected to said solar shield and configured to pull said solar shield into said shielding position, said fusible link preventing said tensile member from pulling said shield assembly into said shielding position.

5. The solar panel assembly according to claim 4, further comprising a track connected to said frame, said tensile member being held between said track and said frame.

6. The solar panel assembly according to claim 4, wherein said tensile member is connected to an end of said frame such that said tensile member is configured to pull said solar shield across a length of said solar harvesting surface.

7. The solar panel assembly according to claim 4, wherein said solar shield is a roll of material.

8. The solar panel assembly according to claim 2, wherein said fusible link prevents gravity from pulling said solar shield into said shielding position from said operating position.

9. The solar panel assembly according to claim 1, wherein said shield assembly includes a hinge connecting said solar shield to said frame, said hinge being biased toward said solar harvesting surface.

10. The solar panel assembly according to claim 9, wherein said heat sensitive element is a fusible link connected to said solar shield and preventing said hinge from biasing said solar shield toward said solar harvesting surface.

11. The solar panel assembly according to claim 10, wherein said frame includes at least one leg, said fusible link being connected to said at least one leg.

12. The solar panel assembly according to claim 1, wherein said heat sensitive element is a thermal gate configured to hold said solar shield in said operating position.

13. The solar panel assembly according to claim 12, wherein said thermal gate is configured to release said solar shield into said shielding position one of at and above said activation temperature.

14. A solar panel assembly, comprising:
    a solar panel having a frame and a solar harvesting surface held by said frame;
    a shield assembly having a solar shield movable between an operation position and a shielding position, said solar shield at least partially covering said solar harvesting surface in said shielding position; and
    a heat sensitive element associated with said solar shield and defining an activation temperature, said heat sensitive element allowing said solar shield to assume said shielding position from said operating position after said heat sensitive element at least one of reaches and exceeds said activation temperature;
    wherein said heat sensitive element at least one of melts, chars, disintegrates, boils, and bursts at said activation temperature.

15. The solar panel assembly according to claim 14, wherein said heat sensitive element is a fusible link holding said solar shield in said operating position.

16. The solar panel assembly according to claim 14, further comprising a tensile member connected to said solar shield and configured to pull said solar shield into said shielding position, said heat sensitive element preventing said tensile member from pulling said shield assembly into said shielding position below said activation temperature.

17. The solar panel assembly according to claim 14, wherein said heat sensitive element impedes said solar shield moving to said shielding position from said operating position until after said heat sensitive element at least one of reaches and exceeds said activation temperature.

* * * * *